United States Patent
Gibson

(10) Patent No.: US 8,242,352 B1
(45) Date of Patent: *Aug. 14, 2012

(54) NOTCH STRUCTURE FOR CONCENTRATING MODULE AND METHOD OF MANUFACTURE USING PHOTOVOLTAIC STRIPS

(75) Inventor: Kevin R. Gibson, Redwood City, CA (US)

(73) Assignee: Solaria Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/247,980

(22) Filed: Sep. 28, 2011

Related U.S. Application Data

(63) Continuation of application No. 12/200,921, filed on Aug. 28, 2008, now Pat. No. 8,049,098.

(60) Provisional application No. 60/969,949, filed on Sep. 5, 2007.

(51) Int. Cl.
*H02N 6/00* (2006.01)
*C03B 17/00* (2006.01)

(52) U.S. Cl. ............ 136/246; 136/259; 65/90
(58) Field of Classification Search .......... 136/246, 136/259; 359/894; 65/90
See application file for complete search history.

*Primary Examiner* — Basia Ridley
*Assistant Examiner* — Tamir Ayad
(74) *Attorney, Agent, or Firm* — Richard T. Ogawa; Ogawa P.C.

(57) ABSTRACT

The invention provides a solar concentrator structure including a first concentrating element. The first concentrating element includes a first aperture region, a first exit region, a first side and a second side. The solar concentrator structure further includes a second or more concentrating elements integrally coupled with the first concentrating element in a parallel manner. The second concentrating element includes a second aperture region, a second exit region, the third side, and a fourth side. The third side joins with the second side to form an apex notch structure characterized by a radius of curvature. Additionally, the solar concentrator structure includes a separation region by a width separating the first exit region from the second exit region and a triangular region including the apex notch structure and a base defined by the separation region and a refractive index of about 1 characterizing the triangular region.

10 Claims, 5 Drawing Sheets

NOTCH STRUCTURE FOR CONCENTRATING MODULE AND METHOD OF MANUFACTURE USING PHOTOVOLTAIC STRIPS

CROSS-REFERENCES TO RELATED APPLICATIONS

This application is a continuation of U.S. patent application Ser. No. 12/200,921, filed on Aug. 28, 2008, which claims priority to U.S. Provisional Patent Application No. 60/969,949, filed Sep. 5, 2007, and which is incorporated by reference in its entirety herein for all purposes.

BACKGROUND OF THE INVENTION

The present invention relates generally to solar energy techniques. In particular, the present invention provides a method and resulting solar concentration module fabricated from a plurality of concentrating elements respectively coupled to a plurality of photovoltaic strips. More particularly, the present method and structure are directed to a notch structure between a pair of the plurality of concentrating elements. In a specific embodiment, the notch structure is implemented to improve efficiency of the multiple concentrator structure. Merely by way of example, the invention has been applied to solar panels, commonly termed modules, but it would be recognized that the invention has a much broader range of applicability.

As the population of the world increases, industrial expansion has lead to an equally large consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies developed often capture solar energy, concentrate it, store it, and convert it into other useful forms of energy.

Solar panels have been developed to convert sunlight into energy. As merely an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successful for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of silicon bearing wafer materials. Such wafer materials are often costly and difficult to manufacture efficiently on a large scale. Availability of solar panels is also somewhat scarce. That is, solar panels are often difficult to find and purchase from limited sources of photovoltaic silicon bearing materials. These and other limitations are described throughout the present specification, and may be described in more detail below.

From the above, it is seen that techniques for improving solar devices is highly desirable.

BRIEF SUMMARY OF THE INVENTION

The present invention relates generally to solar energy techniques. In particular, the present invention provides a method and resulting device fabricated from a plurality of concentrating elements respectively coupled to a plurality of photovoltaic regions. More particularly, the present method and structure are directed to a notch structure provided between a pair of concentrating elements. In a specific embodiment, the notch structure is implemented to improve efficiency of the multiple concentrator structure. Merely by way of example, the invention has been applied to solar panels, commonly termed modules, but it would be recognized that the invention has a much broader range of applicability.

In a specific embodiment, the invention provides a solar concentrator structure. The solar concentrator structure includes a first concentrating element. The first concentrating element includes a first aperture region, a first exit region, a first side and a second side. The solar concentrator structure further includes a second or more concentrating elements integrally coupled with the first concentrating element in a parallel manner. The second concentrating element includes a second aperture region, a second exit region, the third side, and a fourth side. The third side joins with the second side to form an apex notch structure. Additionally, the solar concentrator structure includes a separation region provided between the first concentrating element and the second concentrating element. The separation region is characterized by a width separating the first exit region from the second exit region. Moreover, the solar concentrator structure includes a radius of curvature of 0.1 mm and less characterizing the apex notch structure. The solar concentrator structure further includes a triangular region including the apex notch structure and a base defined by the separation region and a refractive index of about 1 characterizing the triangular region.

In another specific embodiment, the invention provides a solar module with light concentrator structure for photovoltaic strips. The solar module includes a front cover member including a webbing with a flat front plane, a back plane, a first thickness provided between the front plane and the back plane, a plurality of concentrating elements integrally formed in a parallel manner extending from a first edge to a second edge at the back plane, and a peripheral region free of any concentrating element. Each of the plurality of concentrating elements includes an aperture region, an exit region, a second thickness provided between the aperture region and the exit region, and two sides connecting the aperture region and the exit region. The exit region includes a bottom surface and two corner structures. Additionally, the solar module includes a plurality of triangular notches separating each of the plurality of concentrating elements from its neighbor one. Each of the plurality of triangular notches includes an apex region. The solar module further includes a first radius of curvature of 0.1 mm and less characterizing the apex region, a second radius of curvature of 0.2 mm or less characterizing the two corner structures, and a first refractive index of about 1.45 or higher characterizing the webbing with the plurality of concentrating elements. Moreover, the solar module includes an optical coupling material applied overlying all exit regions of the plurality of concentrating elements and a plurality of photovoltaic strips bonded to all exit regions via the optical coupling material. The solar module further includes a plurality of triangular shaped region including the corresponding plurality of triangular notches and a second refractive index of about 1 characterizing the plurality of triangular regions. Furthermore, the solar module includes a back cover member including an electric circuit board and a edge wall. The edge wall is configured to clamp with the front cover member at the peripheral region. The electric circuit board includes an input/output circuit block configured to couple with the plurality of photovoltaic strips.

In yet still an alternative embodiment, the present invention provides a method for manufacturing a light concentrator for solar module. The method includes providing a molten ribbon glass and forming a concentrator structure by molding the molten ribbon glass. The concentrator structure includes a first concentrating element. The first concentrating element includes a first aperture region, a first exit region, a first side and a second side. The concentrator structure further includes a second or more concentrating elements integrally coupled with the first concentrating element in a parallel manner. The second concentrating element includes a second aperture region, a second exit region, the third side, and a fourth side. The third side joins with the second side to form an apex notch structure. The concentrator structure additionally includes a separation region provided between the first concentrating element and the second concentrating element. The separation region is characterized by a width separating the first exit region from the second exit region. The concentrator structure further includes a radius of curvature of a first value characterizing the apex notch structure, a triangular region including the apex notch structure and a base defined by the separation region, and a refractive index of about 1 characterizing the triangular region. Furthermore the method includes polishing all sides to a 30 nm RMS or less and reducing the radius of curvature from the first value to 0.1 mm or less.

Many benefits are achieved by way of the present invention over conventional techniques. For example, the present technique an improved light concentrator that can be made of glass or plastic material and implemented as a top cover member as a single piece of webbing integrally including a plurality of concentrating elements for coupling with a plurality of photovoltaic strips. In a preferred embodiment, the invention provides a glass concentrator having a characteristic from the thickness of the glass webbing to sustain a load of at least 2400 Pa uniformly applied on the webbing surface for 1 hour in two cycles. Also in a preferred embodiment, the invention provides a glass concentrator having a geometric concentration characteristic with an aperture to exit ratio in a range from about 1.8 to about 4.5 and polished side regions with RMS roughness less than 30 nm. Particularly, between each neighboring concentrating elements there exists an apex notch structure characterized by a radius of curvature. In a preferred embodiment, the invention provides a notch structure with a minimized radius of curvature to limit the module efficiency loss due to the notch structure less than 5%. In one embodiment, the invention provides a method for manufacture the concentrator structure with integrally formed concentrating elements and minimized notch radius of curvature. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention relates generally to solar energy techniques. In particular, the present invention provides a method and resulting device fabricated from a plurality of concentrating elements respectively coupled to a plurality of photovoltaic regions. More particularly, the present method and structure are directed to a notch structure provided between a pair of concentrating elements. In a specific embodiment, the notch structure is implemented to improve efficiency of the multiple concentrator structure. Merely by way of example, the invention has been applied to solar panels, commonly termed modules, but it would be recognized that the invention has a much broader range of applicability.

Figure 1:
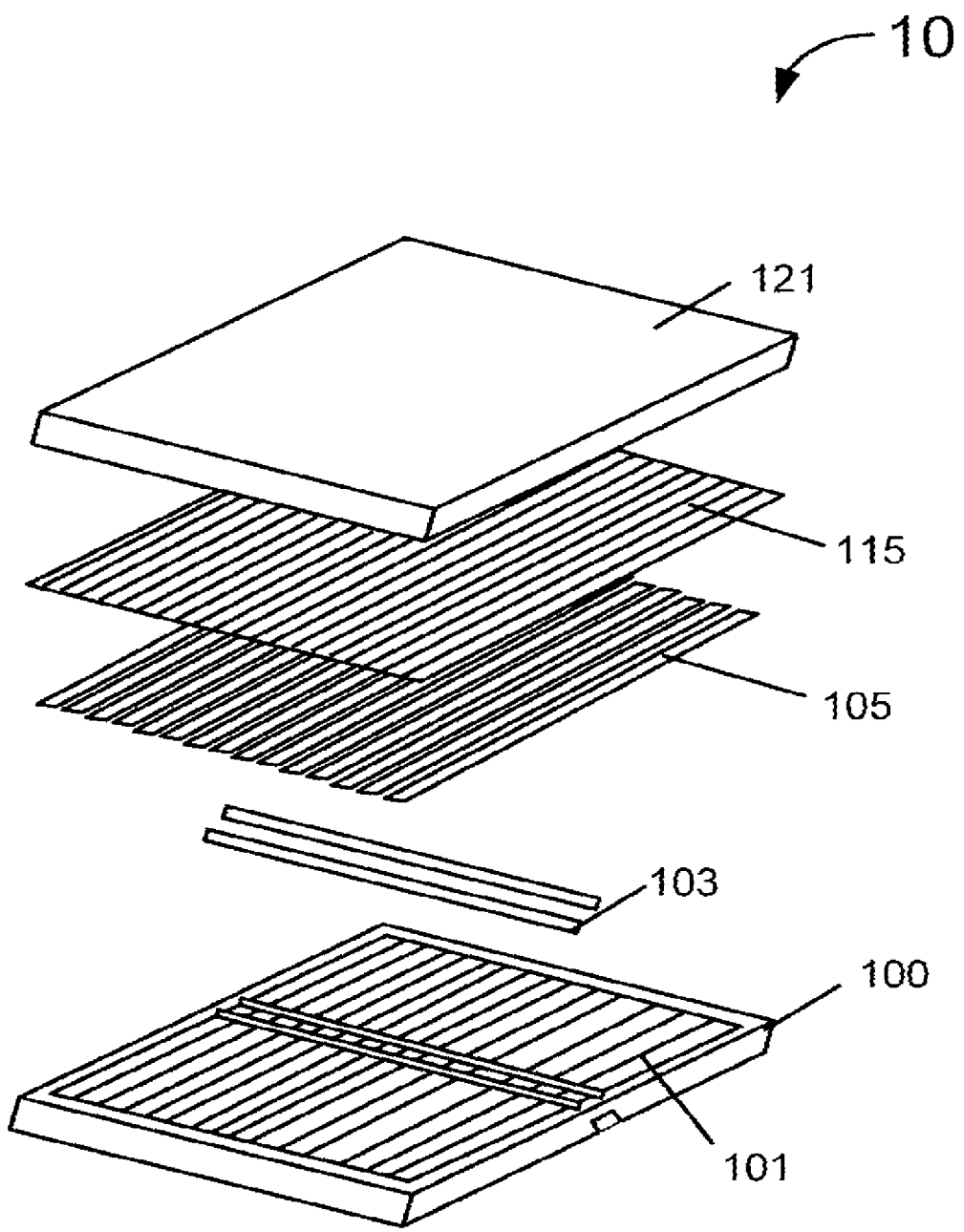
FIG. 1 is a simplified diagram of a solar module according to an embodiment of the present invention.

FIG. 1 is a simplified diagram of a solar concentrator module according to an embodiment of the present invention. This diagram is merely an example, which should not unduly limit the scope of the claims herein. One of ordinary skill in the art would recognize other variations, modifications, and alternatives. As shown is an expanded view of the present solar concentrator module structure, which includes various elements. The module has a back cover member 101, which includes a surface area and a back area. The surface area of the back cover member also has a plurality of sites, which are spatially disposed, for electrical members, such as bus bars or other components of an electric circuit board. Additionally, the back cover member has a peripheral edge wall with a pre-determined height sufficient for enclosing all other module components after assembly. Alternatively, the back cover member can be free from any patterns and is merely provided for support and packaging. The module also has a front cover member 121, which is a webbing with a flat front plane and a plurality of shaped light concentrating elements (not explicitly shown) integrally formed on a back plane. In one embodiment, each of the plurality of concentrating elements is an elongated structure with a cross-sectional shape having a geometric optical concentration characteristic. The sunlight collected by an aperture region of each concentrating element can be well reflected by two side surfaces and directed to an exit region which has an dimension equal to or less than a half of the aperture region. Additionally, the webbing has a peripheral regions free of any concentrating elements, which provides a space for clamping with the back cover member in the final module package. Of course, there can be other variations, modifications, and alternatives.

An optical coupling material 115 is applied overlying the exit region of each of the plurality of concentrating elements. The coupling material 115 is for bonding the plurality of photovoltaic strips 105 pre-cut into a dimension substantially match with the exit region. This optical coupling material also has its refractive index substantially matching with that of the webbing with concentrating elements so that the sunlight can be passed through the exit region to reach the photovoltaic strips 105 with minimized loss. In one embodiment, the optical coupling material is an optical epoxy. For example, the optical epoxy is aliphatic polyurethane. Of course, there can be other variations, modifications, and alternatives.

In a preferred embodiment, the solar concentrator module has a plurality of photovoltaic strips 105, each of which is disposed overlying the exit region of each of the plurality of concentrating elements coupled by the optical coupling material 115. In one embodiment, a length of the exit region for one concentrating element may be much longer than one pre-prepared photovoltaic strip so that two or more photovoltaic strips are needed to cumulatively occupy the corresponding exit region. In another embodiment, the plurality of photovoltaic strips correspond to a cumulative area occupying a total photovoltaic spatial region, which is only a half or less than total physical area of the solar concentrator module. The total photovoltaic spatial region is an active region for converting sunlight into electrical energy. It is to be appreciated that embodiment can have many variations. For example, the embodiment may further includes a first electrode member that is coupled to a first region of each of the plurality of photovoltaic strips and a second electrode member coupled to a second region of each of the plurality of photovoltaic strips.

In one embodiment, the solar concentrator module may include one or more bus bars 103 which are disposed in a perpendicular direction relative to the photovoltaic strips 105. The bus bar may be a thin metal foil or solid bar that is interconnected with a plurality of electric wires built along each of the plurality of photovoltaic strips 105. The electric wire of each photovoltaic strip may be coupled to the corresponding first and second electrode members. The bus bars are used for conducting and coupling the electric currents generated by each photovoltaic strips to an output circuit block of the solar concentrator module. In another embodiment, the bus par may be replaced by a printed electric circuit board built in the front surface of the back cover member 101. Of course, there can be other variations, modifications, and alternatives.

Upon assembly of the front cover, optical coupling material, photovoltaic strips, bus bars, and back cover, an interface region is provided along at least the peripheral region of the front cover member and the edge wall of the back cover member. The interface region may also be provided surrounding each of the strips or certain groups of the strips depending upon the embodiment. In one embodiment, The solar concentrator module has a sealed interface region after clamping the peripheral edge wall of the back cover member with the peripheral region of the front cover member. The sealed region maintains the active regions, including photovoltaic strips, in a controlled environment free from external effects, such as weather, mechanical handling, environmental conditions, and other influences that may degrade the quality of the solar cell. Additionally, the sealed region and/or sealed member (e.g., two substrates) protect certain optical characteristics associated with the solar cell and also protects and maintains any of the electrical conductive members, such as bus bars, interconnects, electric circuit board and the like. In another embodiment, there is an air gap between the photovoltaic strips and the back cover member and the interface region is not completely vacuum tight. For example, one or more pin-holes may be intentionally made for air to breath in and out. Of course, there can be other variations, modifications, and alternatives.

In a preferred embodiment, the total photovoltaic spatial region occupies a smaller spatial region than the surface area of the cover members. That is, the total photovoltaic spatial region uses less photovoltaic material than conventional solar cells for a given solar module size. In a preferred embodiment, the total photovoltaic spatial region occupies about 80% and less of the surface area of the back cover for the individual solar module. Depending upon the embodiment, the photovoltaic spatial region may also occupy about 70% and less or 60% and less or preferably 50% and less of the surface area of the back cover or given area of a solar module. Of course, there can be other percentages that have not been expressly recited according to other embodiments. Here, the terms "back cover member" and "front cover member" are provided for illustrative purposes, and not intended to limit the scope of the claims to a particular configuration relative to a spatial orientation according to a specific embodiment. Further details of each of the various elements in the solar concentrator module can be found throughout the present specification and more particularly below.

In a specific embodiment, the front cover member including the webbing and the plurality of concentrating elements are made of a single piece of glass. For example, this single piece of glass comprises mixed batch materials of sand, limestone, cerium oxide, iron oxide and salt cake. In one embodiment, the glass comprises a concentration of iron content about a trace amount and less. In another embodiment, the glass has cerium oxide at a concentration of about a trace amount and less, or non-existent. In another preferred embodiment, the glass is a tempered glass, processed to meet safety standard enforced by general construction codes. Of course, there can be other variations, modifications, and alternatives.

In one embodiment, the front cover member for solar concentrator module should have a sufficient thickness for certain lateral dimensions selected to satisfy the industry qualification standard regarding to solar module's mechanical toughness. In one embodiment, the front cover member has an 1 meter×1.6 meter lateral dimension. The total thickness of the front cover member includes a first thickness of the webbing and a second thickness of the concentrating element. For example, for an 1.0 m×1.6 m front cover member, the first thickness is at least 3.2 mm and the second thickness is about 1.8 mm. In another example, the preferred first thickness can be in a range of 5 to 7 mm. The sufficient thickness of the front cover member is to ensure an important load sustenance characteristic and impact hail resistance characteristic for the solar concentrator module, although other factors including the composition profile, stress profile, packaging method etc also contribute to these physical characteristics. For example, according to Industrial Qualification Standards, the solar module should be able to sustain a load of 2400 Pa uniformly applied to the surface of the module for 1 hour in two cycles. The solar module should be able to resist a hail impact represented by an ice ball of 25 mm diameter directed at a speed of at least 23 meter per second to 11 (random) locations on entire front plane of about 1 m×1.6 m. For example, the Industrial Qualification Standards for solar module include IEC (International Electrotechnical Commission) 61215, IEC 61730, and UL 1703.

In one embodiment, the glass can be a laminated glass made of polymer which may provide better impact resistance with a same or smaller thickness compared to a conventional solar glass. In another embodiment, the rigid front cover can be made of transparent plastic material. Depending on the applications, the front cover member with the laminated glass or plastic material should also have corresponding characteristic thickness for certain lateral dimensions of the solar concentrator module. Of course, there can be other variations, modifications, and alternatives. Further details of the solar cell assembly can be found in U.S. patent application Ser. No. 12/121,788, commonly assigned, and hereby incorporated by reference herein.

Figure 2A:
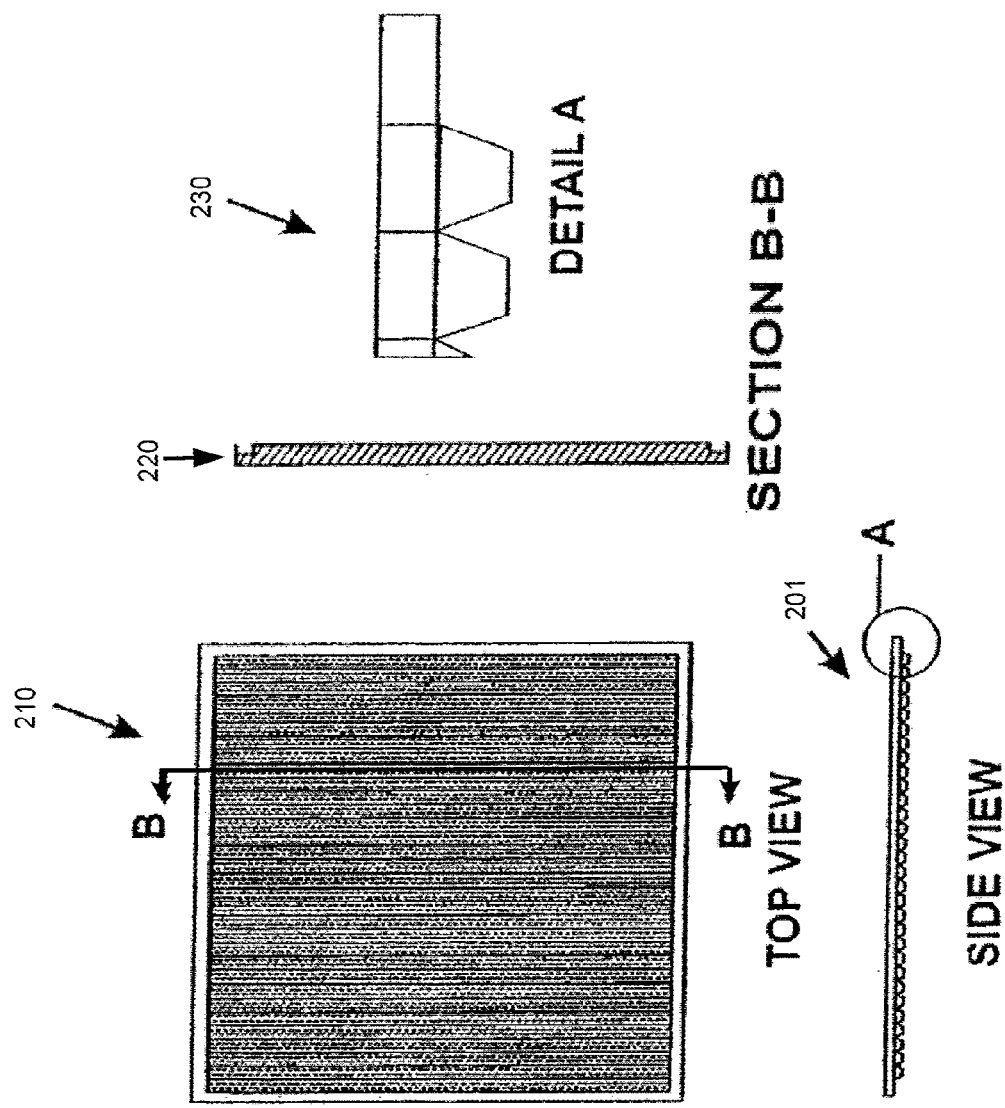
FIG. 2A is a simplified diagram of a concentrator structure including a plurality of concentrating elements according to an embodiment of the present invention.

FIG. 2A is a simplified diagram of front cover member 210 according to an embodiment of the present invention. This diagram is merely an example, which should not unduly limit the scope of the claims herein. One of ordinary skill in the art would recognize other variations, modifications, and alternatives. As shown, the front cover member has been illustrated using a side view 201. The front cover member also has a top-view illustration 210 (from its back plane), where a plurality of elongated concentrating element formed in parallel extending from one side portion to another are seen. A section view 220 from "B-B" and a side view 201 have also been illustrated to show the flat front plane and shape of the plurality of concentrating elements. A detailed view "A" of at least two of the concentrating elements 230 further illustrates the concentrating structure having a trapezoidal shape and a flat peripheral region according to a specific embodiment of the present invention.

Figure 2B:
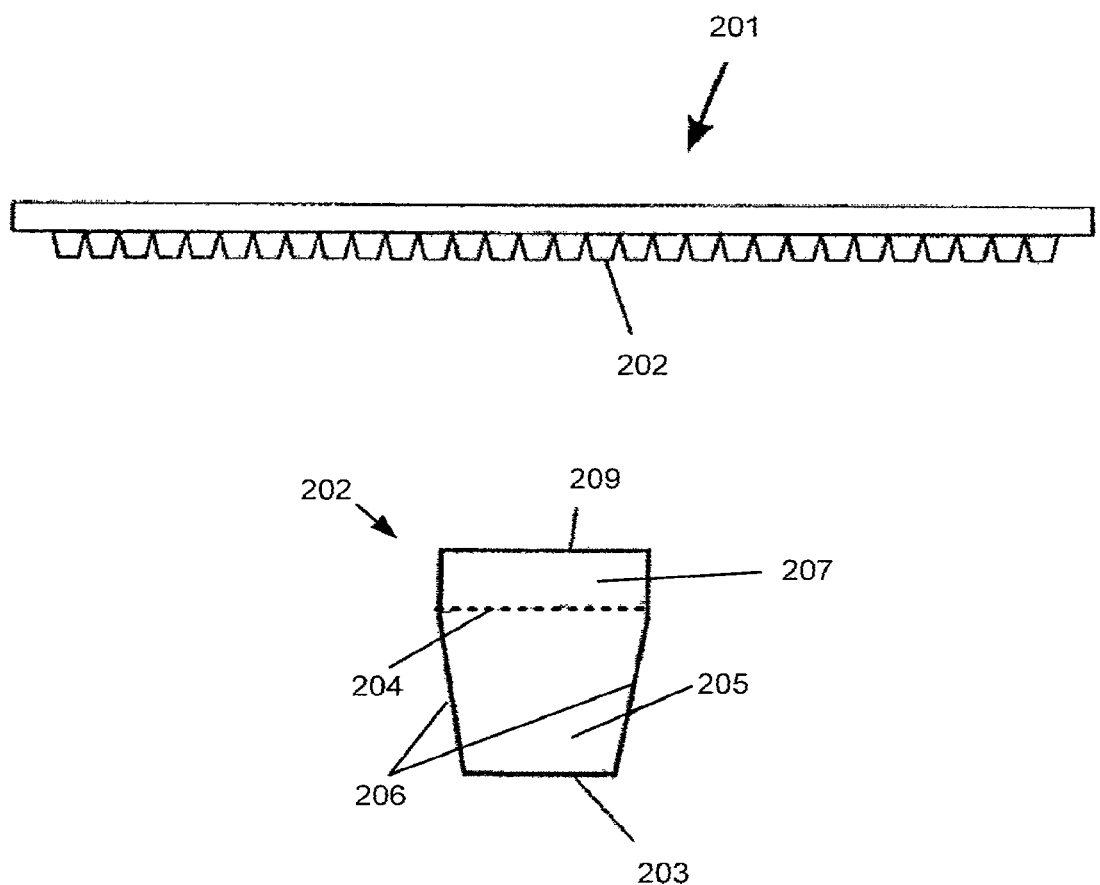
FIG. 2B is a detailed diagram of the concentrator structure shown in FIG. 2A.

FIG. 2B is a simplified diagram of a closer side view of the front cover member in FIG. 2A according to an embodiment of the present invention. This diagram is merely an example, which should not unduly limit the scope of the claims herein. One of ordinary skill in the art would recognize other variations, modifications, and alternatives. As shown, one unit 202 is picked out of the side view 201 of the front cover member. Each of the units is spatially disposed and in parallel to each other according to a specific embodiment. The unit 202 has an upper region 207 and a lower region 205 separated by a dashed line 204 for illustration only. The upper region includes a surface 209, which is co-extensive of the flat front plane. The lower region shows a trapezoidal shaped concentrating element with the dashed line 204 as its top, two sides 206, and a bottom surface 203. In three-dimension space, the dashed line 204 represents a virtual plane as an aperture region for collecting the sunlight inserted through the flat front plane. The two sides 206 are capable of totally reflecting the incoming light and directing the light to the bottom surface 203. For example, the sides are purposely polished to have a roughness of about 30 nanometers RMS and less. Depending on the application, certain coating can be applied at the back surface of the sides 206 for enhancing reflectivity.

The bottom surface 203 represents an exit region for the concentrated sunlight which has a reduced area compared to the aperture region. Here, the term "trapezoidal" may include embodiments with straight or curved or a combination of straight and curved walls according to embodiments of the present invention. Further features of the concentrating elements of the front cover member according to certain embodiments of the present invention are provided more particularly below.

Figure 3:
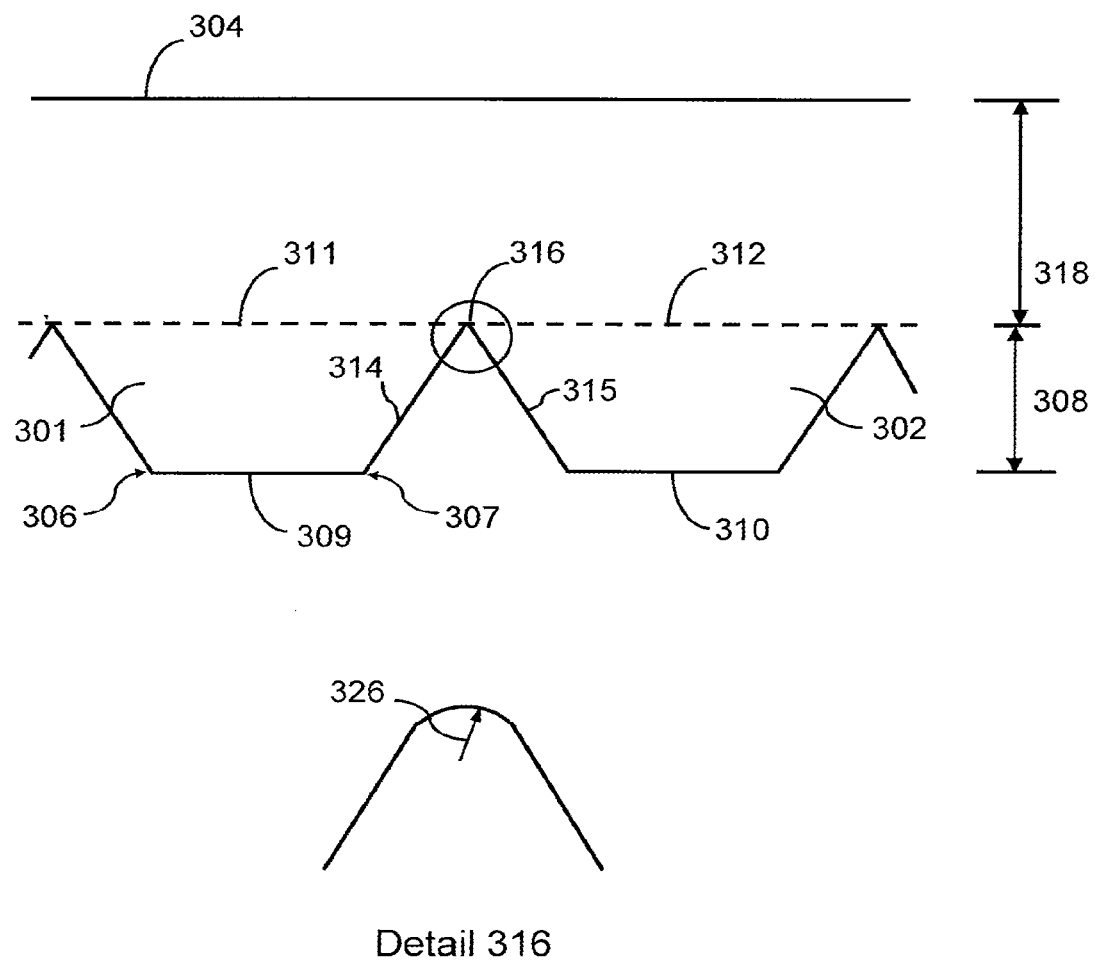
FIG. 3 is a more detailed diagram illustrating two neighboring concentrating elements and the notch structure formed by two joining sides of the concentrating elements according to an embodiment of the present invention.

FIG. 3 is a more detailed diagram illustrating a sectional view of the front cover member with two neighboring concentrating elements according to an embodiment of the present invention. This diagram is merely an example, which should not unduly limit the scope of the claims herein. One of ordinary skill in the art would recognize other variations, modifications, and alternatives. As shown, a first concentrating element 301 joins with a second concentrating element 302 at the back plane of the front cover member. In one embodiment, the first concentrating element 301 has a trapezoidal shape with an aperture region 311, exit region 309 and two sides. Correspondingly, the second concentrating element 302 also has an aperture region 312, exit region 310, and two sides. In another embodiment, the first and second concentrating elements are representatives and identical replica of the plurality of concentrating elements formed at the back plane (indicated by the dashed line in FIG. 3) of the front cover member. Each aperture region corresponds to a dimension W1 and each exit region corresponds to a dimension W2 such that the ratio of W1/W2 is equal to 2.0 or greater. In a specific embodiment, the aperture region and the exit region of each concentrating element has a same dimension in a spatial direction perpendicular to the cross-section shown in FIG. 3, the ratio W1/W2 is equivalent to an area ratio referring to the light concentration characteristic. As shown in FIG. 3, the front cover member with the plurality of concentrating elements also can be characterized by a first thickness 318 between the front plane 304 and the back plane (dashed line) and a second thickness 308 corresponding to the height of the concentrating element.

In a specific embodiment, one side 314 of the first concentrating element 301 joins with one side 315 of the second concentrating element 302 so that an apex is formed. As shown in the bigger view of FIG. 3, the apex of a triangular region includes a notch structure characterized by an apex region 316 and two sides 314 and 315. In a specific embodiment, the sides are straight (or flat in a three-dimensional view). In certain other embodiments, the sides may be curved. The notch structure describes a portion of a cross section of a triangular region provided between a first solar concentration element and a second solar concentration element. The term "notch" is not intended to be limited to the specification but should be construed by a common interpretation of the term. In a specific embodiment, the apex region 316 is characterized by a radius of curvature 326, as shown in the smaller view "Detail 326" of FIG. 3. Depending on the process of making for the plurality of concentrating elements, the apex region 316 may have different radius of curvature. For example, the radius of curvature 326 is 1 mm or less. In one embodiment of present invention, the radius of curvature 326 can be 0.1 mm and less. Preferably, a minimum of radius of curvature is provided to maintain a structure/mechanical integrity of the solar concentrator in the temperature range of about −40 deg Celsius and 85 deg Celsius in accordance with IEC 61215 specification according to a specific embodiment. Of course there can be other modifications, variations, and alternatives.

Because of this finite radius of curvature, the apex region 316 or the notch structure reduces the effective aperture region dimension and the second thickness 308 as well. In other words, a small portion of light rays reaching the apex region 316 may pass through and not be directed to the exit region 309 or 310 because the incident angle is much smaller than the total reflection angle of the interface locally. Only the rest portion of light rays that reaches at the points on the sides 314 or 315, which are somewhat lower than the apex point, away from the curved notch may be directed due to total internal reflection to the exit regions where the photovoltaic strips are attached. Extending from one portion to another of the front cover member, a plurality of such notch structures will contribute the similar light power loss cumulatively. In one embodiment, minimizing the loss of light collected by the front cover member to anywhere other than the photovoltaic strips translates to maximizing the efficiency of the solar concentrator module. For example, the notch structure made for the solar concentrator module according to certain embodiments of the present invention can be controlled so that the module efficiency reduction is less than 5%. Of course there can be other modifications, variations, and alternatives.

In another specific embodiment, as shown in FIG. 3, an exit region 309 can be characterized by a first corner structure 306 and a second corner structure 307 separated by a flat bottom surface. In a specific embodiment, similar to the apex notch structure the corner structure can be characterized by an exit radius of curvature. In a specific embodiment, the exit radius of curvature can be greater than about 0.05 mm. In an alternative embodiment, the exit radius of curvature can range from 0.05 to 0.2 mm. In principle, the exit region includes a total area from which the light rays out of the concentrator can reach the photovoltaic strips. Therefore light rays coming out of the corner structures will affect the efficiency of the solar module depending on whether these light rays can be directed to the photovoltaic strips. The concentration ratio generally decreases with an increase in exit radius of curvature of the corner structure. The irradiation loss also generally increases with an increase of exit radius of curvature. In a specific embodiment, the exit radius of curvature is optimized to allow for a maximum concentration ratio or a minimum scattering loss and to allow for maintaining mechanical/structural integrity of the solar cell concentrator in the temperature range between about −40 deg Celsius and 85 deg Celsius according to IEC 61215 specification according to a preferred embodiment Of course there can be other variations, modifications, and alternatives.

Figure 4:
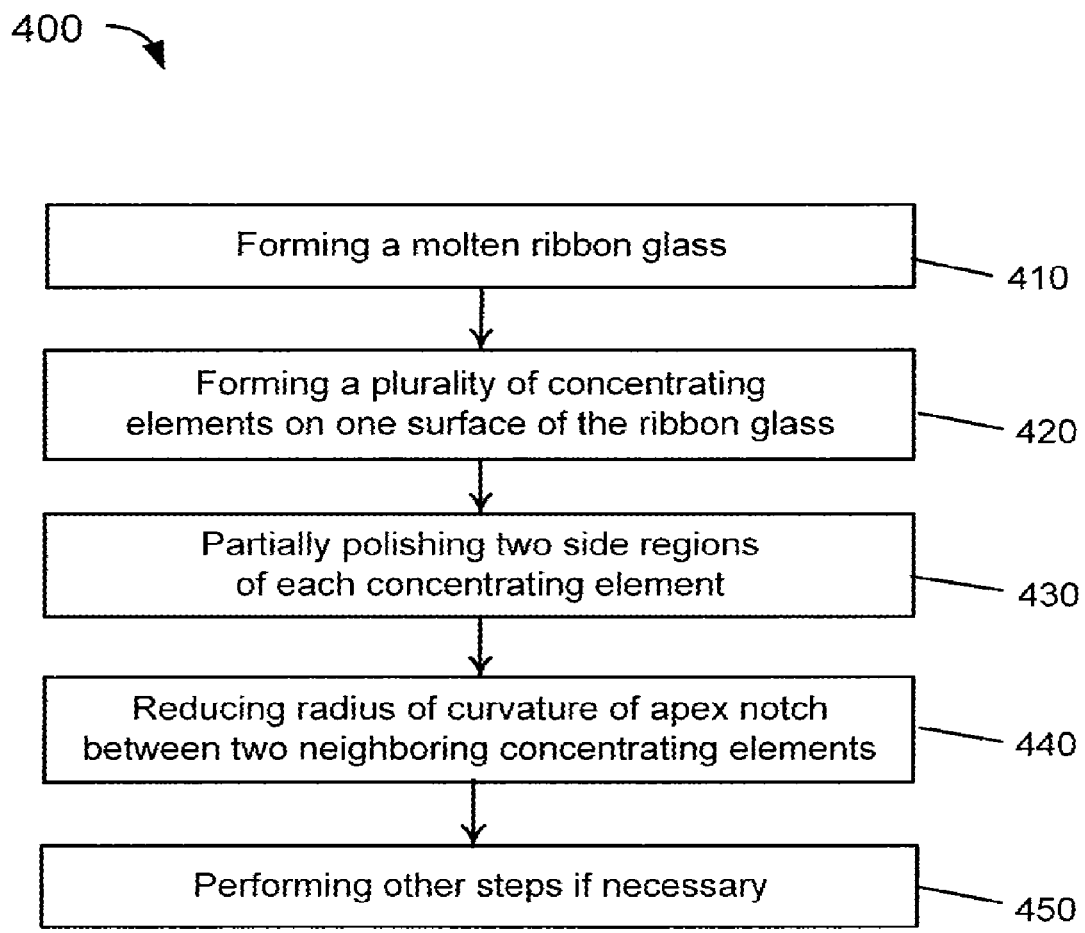
FIG. 4 is a simplified diagram illustrating a method of manufacturing concentrator structure for solar concentrator module according to an embodiment of the present invention.

FIG. 4 is simplified diagram illustrate a method for manufacturing a light concentrator for solar module according to one embodiment of the present invention. This diagram is merely an example, which should not unduly limit the scope of the claims herein. One of ordinary skill in the art would recognize other variations, modifications, and alternatives. As shown, the method 400 of making a light concentrator for solar module is can be outlined as follows:
1. Process 410: Forming a molten ribbon glass;
2. Process 420: Forming a plurality of concentrating elements on one surface of the ribbon glass;
3. Process 430: Partially polishing two side regions of each concentrating element;
4. Process 440: Reducing radius of curvature of apex notch between two neighboring concentrating elements;
5. Process 450: Performing other relevant steps if necessary.

These sequences of processes provide a way of performing a method according to an embodiment of the present invention. As shown, the method can be implemented based on established conventional floating glass manufacturing technology. In one embodiment, the flame polishing treatment is applied as a low cost high quality process for achieving the required small roughness for reflective side regions of the concentrating elements. Of course, there can be variations, modifications, and alternatives. Some processes may be performed in different order. Some processes can be removed or added. For example, when plastic material may be used to replace glass, some process may be implemented by direct molding or using molding roller to form the concentrating elements. These and other details of the present method can be found throughout the present specification and more particularly below.

In process 410, a molten ribbon glass is formed according to some embodiments of present invention using glass as a top cover member including a plurality of light concentrating elements. The melting glass is formed by mixing a group of batch materials including sand, limestone, cerium oxide, iron oxide and salt cake in a furnace. The resulted molten glass may have controlled compositions of a trace or less of iron element and cerium oxide bearing the required physical characteristics including photon absorption, mechanical strength, stress distribution, or refractive index value etc. In one embodiment, the glass is replaced by a plastic material or acrylic polymer. The molten glass with a predetermined amount is fed into a floating bath with pre-determined shape, for example, a rectangular shape with 1 meter times 1.6 meter in dimensions. According to certain embodiments, the amount of the molten glass is sufficient to form a ribbon glass with a first thickness. In a specific embodiment, the first thickness is necessary for possessing sufficient load sustenance and impact hail resistance characteristics for the resulting glass webbing to be used for manufacture of a solar concentrating module. For example, the first thickness is in a range of 7 mm to 9 mm. In another example, the first thickness is at least 5 mm. Of course, there can be other variations, modifications, and alternatives.

In process 420, a plurality of concentrating elements on one surface of the ribbon glass is formed. In one embodiment, the plurality of concentrating elements is formed using a molding roller. The roller is elongated nearly one dimensional and has certain predefined cross-sectional shape, when rolling from one edge of the ribbon glass to another across surface of the ribbon glass, its shape is molded into the ribbon glass one next to another. In a specific embodiment, the shape includes one or more triangular shapes. In another embodiment, the shaped structures formed in above rolling process are a plurality of truncated pyramid shapes with two sides extended in one spatial direction in parallel to the elongated roller or one edge of the ribbon glass. Depending on the triangular shape of the molding roller, each shaped structure unit includes a flat exit region which has a reduced dimension (perpendicular to the elongated roller) compared to the base dimension of each unit which has a second thickness provided between the flat exit region and the base line of the unit. In one specific embodiment, the base of each unit represents an aperture region assuming that the light rays are collected there from and the exit region is for light to be directed out towards the photovoltaic strips attached there. Therefore, a smaller dimension for the exit region versus the aperture region provides a concentration characteristic for the shaped structure unit. In other words, this shaped structure unit becomes one of the plurality of concentrating elements. In a specific embodiment, the ratio of the aperture region to the exit region is 2.0 or larger, which implies that the concentrator can reduce the photovoltaic material by 50% or higher. For example, the aperture region is about 4 mm or larger, and the exit region is about 2 mm or less. The second thickness between the aperture region and the exit region can be about 1.8 mm. Of course, there can be other variations, modifications, and alternatives.

In one embodiment, each of the formed plurality of concentrating elements includes two reflective sides from which the incident light rays through the aperture region will be directed to the exit region. In order to enhance the reflection and reduce scattering loss, the two sides need to be polished to have very small roughness. For example, in the process 430, the two sides of each concentrating element are polished to have a RMS roughness of 30 nm or less. In one embodiment, the polishing is limited to the side regions and an apex region formed by two sides of two neighboring concentrating elements. In another embodiment, the polishing can be implemented using a flame polishing technique using a nearly-one-dimensional burner placed in parallel to the elongated concentrating elements. The burner is configured to move across a plurality of concentrating elements to perform the flame polishing one-by-one. In another embodiment, multiple one-dimensional burners can be implemented in parallel to perform flame polishing at the same time. Of course, there can be other variations, modifications, and alternatives. For example, the polishing process can be implemented using an acid etching technique. In another example, the polishing process can be implemented using a vapor polishing technique.

In an alternative embodiment, the formed concentrating elements has a plurality of triangular notch regions separating two neighboring concentrating elements. Each notch region includes an apex region which is a jointing point of two sides of corresponding two neighboring concentrating elements. After the initial formation of the plurality of concentrating elements, the apex region is associated with a radius of curvature with a first value. Depending on the forming process of the concentrating elements the first value of the radius of curvature could be quite large. According to an embodiment of the present invention, any radius of curvature of the apex region will reduce the dimension of an effective aperture region. The effective aperture region is an area where the light rays collected can be truly directed to the exit region attached with photovoltaic materials. In other words, some light rays land on the curved apex notch may scatter away or pass to area outside the exit region of the concentrating element, resulting in a loss of efficiency of the light concentration. Ideally, only the true point apex can provide zero loss. Therefore, in the process 440 the apex notch is processed to reduce the radius of curvature from a first value to a much lower value for minimizing the loss of light. In one embodiment, the processing of the apex notch structure may also involve etching or flame polishing to reduce the radius of curvature. For example, assuming the aperture region has a dimension of about 4 mm, the radius of curvature of the apex notch structure may be reduced to 0.10 mm or less. In one embodiment, this may effectively limit the loss of efficiency of the plurality of concentrating elements to about 5% and less. Of course, there can be other variations, modifications, and alternatives.

Furthermore, in the process 450 other processes may be performed for manufacturing the light concentrator if necessary. For example, the process 450 may include polishing the corners between the side and the flat exit region to reduce the radius of curvature of the corner structures. The finite radius of curvature may cause some light rays reaching to the curved corners to be scattered away and be directed outside the photovoltaic material attached with the exit region. This effectively increase the area of the exit region or lower efficiency of the light concentration. In another embodiment, other than processing to minimize the radius of curvature of the corners, properly applying a refractive-index-matching optical coupling material around the corners may help to re-direct those light rays towards the photovoltaic strips attached next to the exit region. In another example, certain reflectivity enhancement coating may be applied onto the sides of the concentrating elements in the process 450. In certain embodiment, this kind of coating helps to properly direct the light rays in oblique angles to the photovoltaic strips which has a substantially similar lateral dimension of the exit region. In yet another example, a coating for reducing internal interface reflection at the exit region can be overlaid before applying the optical coupling material to the exit region through which a plurality of photovoltaic strips are bonded. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A solar module with light concentrator structure for photovoltaic strips, the solar module comprising:
   a front cover member including a webbing with a flat front plane, a back plane, a first thickness provided between the front plane and the back plane, a plurality of concentrating elements integrally formed in a parallel manner extending from a first edge to a second edge, and a peripheral region, each of the plurality of concentrating elements including an aperture region, an exit region, a second thickness provided between the aperture region and the exit region, and two sides connecting the aperture region and the exit region;
   a plurality of triangular notches separating each of the plurality of concentrating elements from its neighbor one, each of the plurality of triangular notches including an apex region;
   a first radius of curvature of 0.10 mm to 0.005 mm characterizing the apex region;
   a first refractive index of about 1.45 or higher characterizing the webbing with the plurality of concentrating elements;
   an optical coupling material applied overlying all exit regions of the plurality of concentrating elements;
   a plurality of photovoltaic strips bonded to all exit regions via the optical coupling material;
   a plurality of triangular shaped regions including the corresponding plurality of triangular notches; and
   a second refractive index of about 1 characterizing the plurality of triangular regions,
   wherein the first thickness ranges from 5 to 7 mm.

2. The solar module of claim 1 wherein the first cover member is a single piece of transparent solid characterized by a refractive index of 1.4 or larger and a transmissivity of 90% or higher; and further comprising a back cover member.

3. The solar module of claim 1 wherein the single piece of transparent solid is glass, polymeric material, or plastic material.

4. The solar module of claim 1 wherein each of the plurality of concentrating elements comprises a truncated pyramid shape with the two sides extended in a spatial direction which is in parallel with the first edge and the second edge.

5. The solar module of claim 1 wherein the peripheral region comprises a lateral dimension of about 10 mm and is free from any concentrating elements.

6. The solar module of claim 1 wherein each of the plurality of concentrating elements is characterized by an aperture region/exit region ratio of 2.0 or larger.

7. The solar module of claim 1 wherein the first radius of curvature of the apex region effectively reduces an efficiency of the plurality of concentrating elements by about 5% and less by reducing effective aperture region.

8. The solar module of claim 1 wherein the plurality of photovoltaic strips are made of at least one material selected from single crystal silicon, polycrystalline silicon, amorphous silicon, copper indium diselenide (CIS), Copper Indium Gallium Selenide (CIGS), Cadmium Telluride (CdTe), thin film materials, or nanostructure materials.

9. The solar module of claim 1 wherein the plurality of triangular shaped regions including the corresponding plurality of triangular notches is a cavity.

10. The solar module of claim 1 wherein the peripheral region is free from concentrating elements.

* * * * *